United States Patent [19]

Nakamura et al.

[11] Patent Number: 4,636,929
[45] Date of Patent: Jan. 13, 1987

[54] ABNORMAL STATE DETECTING CIRCUIT OF INVERTER

[75] Inventors: Tooru Nakamura; Shigenori Higashino, both of Hyogo, Japan

[73] Assignee: Mitsubishi Denki Kabushiki Kaisha, Tokyo, Japan

[21] Appl. No.: 823,955

[22] Filed: Jan. 29, 1986

[30] Foreign Application Priority Data

Mar. 19, 1985 [JP] Japan ................................. 60-57344

[51] Int. Cl.$^4$ ............................................. H02H 7/122
[52] U.S. Cl. ....................................... 363/56; 363/98; 363/132
[58] Field of Search ...................... 363/55, 56, 57, 58, 363/98, 132

[56] References Cited

U.S. PATENT DOCUMENTS 4,589,050  5/1986  Cutler et al. ........................... 363/57

FOREIGN PATENT DOCUMENTS 103138    9/1978  Japan ..................................... 363/54
59-26190  6/1984  Japan .
1528406  10/1978  United Kingdom ................. 363/56

Primary Examiner—Peter S. Wong
Assistant Examiner—Judson H. Jones
Attorney, Agent, or Firm—Bernard, Rothwell & Brown

[57] ABSTRACT

In an inverter circuit composed of arms of at least one pair, connected between positive and negative lines of DC power source and turned on or off alternately, an abnormal state detecting circuit compares the neutral potential of the pair of arms with the neutral potential of the DC power source, and discriminates the abnormal state of the switching operation of the arms if the comparison result becomes less than a prescribed value.

2 Claims, 10 Drawing Figures

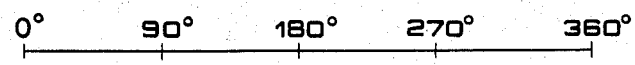
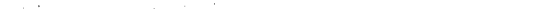
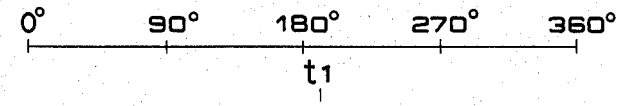

ABNORMAL STATE DETECTING CIRCUIT OF INVERTER

BACKGROUND OF THE INVENTION

1. Field of the Invention

The present invention relates to abnormal state detecting circuits of an inverter, and more specifically to an abnormal state detecting circuit of an inverter wherein abnormal state can be rapidly detected in open-phase state or simultaneous ignition of upper and lower arms.

2. Description of the Prior Art

FIG. 1 shows an abnormal state detecting circuit of an inverter in the prior art. In FIG. 1, reference numeral 1 designates DC power source. SCR1 and SCR2, and SCR3 and SCR4 designate thyristors to constitute pairs of arms respectively. A circulation diode and a transfer circuit are unnecessary for the description and therefore shall be omitted. Numeral 2 designates an inverter transformer, and a current transformer 3 is installed on the primary winding TR1 of the inverter transformer 2. A resistor 4 is connected in parallel to the output end of the secondary winding of the current transformer 3. Voltage drop of the resistor 4 is compared with a reference voltage 5 by a comparator 6.

Operation of the detecting circuit in the prior art will now be described. If current $i_b$ flowing through closed circuit of DC power source 1-TR1-SCR2-DC power source 1 in FIG. 1 becomes overcurrent by any reason, current flowing through the current transformer 3 increases and the voltage drop in the resistor 4 increases and becomes more than the reference voltage 5. Then the comparator 6 outputs an overcurrent signal 7 of the inverter transformer primary winding. Thus in the prior art, an abnormal state cannot be detected if the overcurrent is not generated as a result of fault in the inverter. In this constitution, when the inverter transformer is partially excited by ignition failure of one arm, i.e. fault of open-phase mode and therefore time is required before the overcurrent flows, the detection may be delayed. Furthermore, when a pair of arms connected between positive and negative poles of the DC power source are subjected to simultaneous open-phase state or simultaneous ignition, the detection cannot be performed at all.

SUMMARY OF THE INVENTION

An object of the invention is to provide an abnormal state detecting circuit of an inverter, which eliminates disadvantages in the prior art and is useful.

Another object of the invention is to provide an abnormal state detecting circuit of an inverter, which can rapidly detect open-phase mode and shortcircuit mode of an arm among fault of the inverter although impossible in the prior art.

Other objects and advantages of the invention will be apparent from the following detailed description of the embodiment taken in conjunction with the accompanying drawings.

BRIEF DESCRIPTION OF THE DRAWINGS

FIGS. 3(a)–3(d) are waveform charts illustrating operations of the detecting circuit of FIG. 2; and FIGS. 4(a)–4(d) are waveform charts illustrating switching operations of the detecting circuit of FIG. 2.

PREFERRED EMBODIMENT OF THE INVENTION

An embodiment of the invention will now be described referring to FIGS. 2–4.

Figure 1:
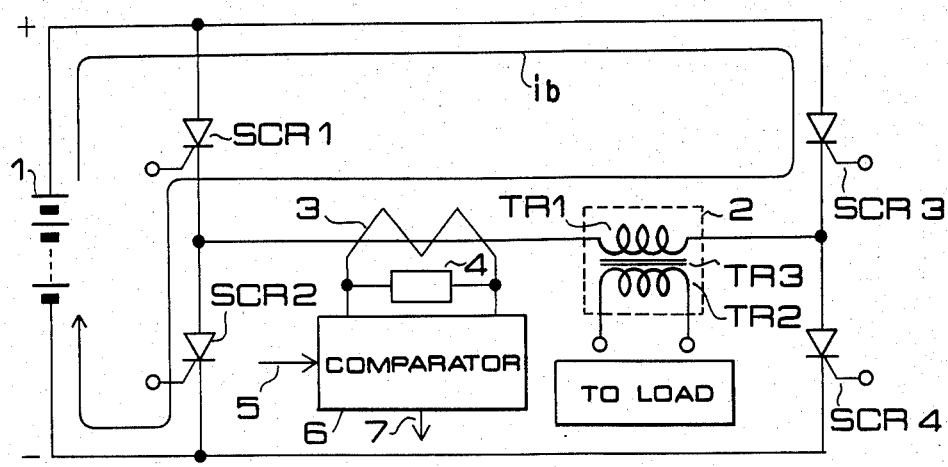
FIG. 1 is a circuit diagram of an abnormal state detecting circuit of an inverter in the prior art.
Figure 2:
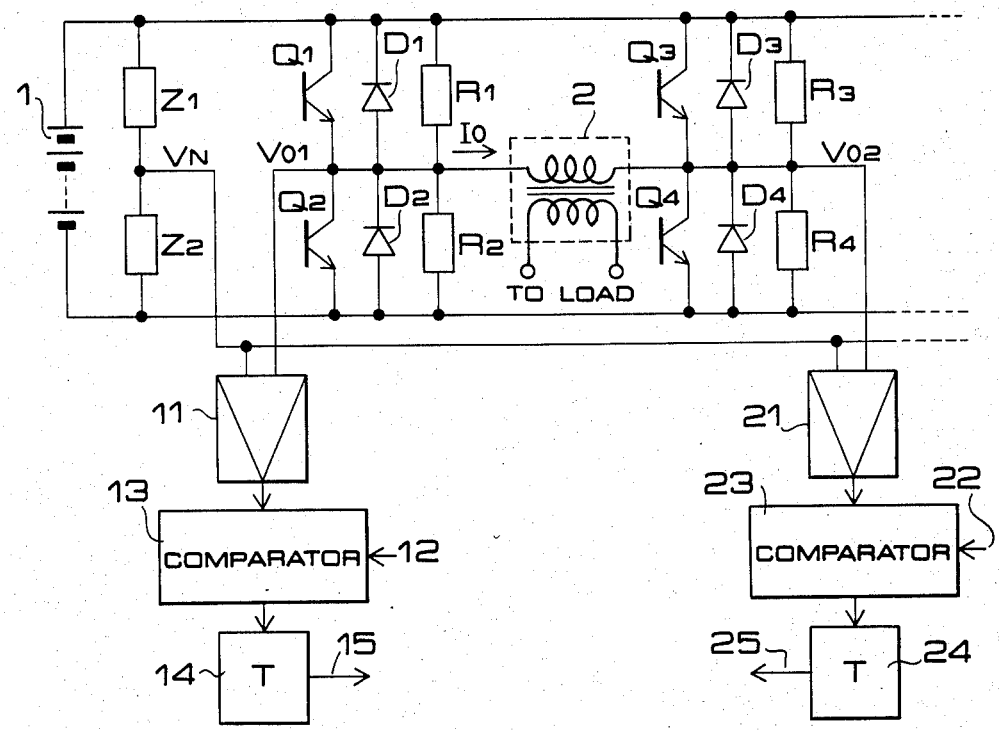
FIG. 2 is a circuit diagram of an abnormal state detecting circuit of an inverter as an embodiment of the invention.

In FIG. 2, reference numeral 1 designates DC power source. $Q_1$ and $Q_2$, and $Q_3$ and $Q_4$ designate transistors to constitute pairs of arms respectively, and diodes $D_1$, $D_2$, $D_3$, $D_4$ are connected in reverse parallel connection to the transistors $Q_1$, $Q_2$, $Q_3$, $Q_4$ respectively. Symbols $Z_1$, $Z_2$ designate impedance to make the neutral potential $V_N$ of the DC power source 1, and numeral 11 designates a differential amplifier to detect the differential voltage between $V_N$ and potential $V_{01}$ at the output end of the pair of arms of the inverter. A comparator 13 compares the differential voltage of the differential amplifier 11 with reference voltage 12, and if an abnormal state occurs in the inverter the comparator 13 transmits an abnormal state signal 15 through a suitable delay element 14. Numerals 21–25 designate a circuit to compare potential $V_{02}$ at output end of other pair of arms with the neutral potential of the DC power source 1, and correspond to numerals 11–15. Symbols $R_1$–$R_4$ designate resistors to determine potential of $V_{01}$, $V_{02}$ when the transistors $Q_1$–$Q_4$ are in the OFF state.

Operation of the detecting circuit will now be described.

Switching operation of the transmitters $Q_1$, $Q_2$ to constitute one pair of arms is performed at the normal state as shown in FIGS. 3(a), (b). Hatched portion in the figure represents the period of the transistors $Q_1$, $Q_2$. In this case, potential at the junction of the transistors $Q_1$, $Q_2$ varies as shown in FIG. 3(c). This represents current supplied to the primary winding of the inverter transformer 2.

When the inverter acts normally, $V_N$ and $V_{01}$ are inputted to the differential amplifier 11 as shown in FIG. 3(c) and signal of positive or negative polarity is normally outputted to the output end of the differential amplifier 11. If absolute value of the signal is selected higher than the level of the reference voltage 12 with positive or negative polarity, the comparator 13 does not detect an abnormal state and therefore the abnormal state signal 15 is not generated.

Next, operation in open-phase state of the inverter will be described FIGS. 4(a), (b) show the switching waveform of the transistors $Q_1$, $Q_2$. If the transistor $Q_2$ is in open-phase state at time $t_1$, potential $V_{01}$ at the junction of the transistors $Q_1$ and $Q_2$ has the waveform shown in FIG. 4(c). At time $t_2$, potential $V_{01}$ first becomes a value nearly equal to the neutral potential $V_N$ of the DC power source 1. At times $t_3$, $t_4$, $t_5$ ..., the period of $V_{01}$ and $V_N$ being nearly equal is started. FIG. 4(d) shows the primary current of the inverter transformer 2 when an open-phase state occurs in the inverter.

If the open-phase state occurs in the inverter as above described, the period of $V_{01}$ and $V_N$ being nearly equal is produced. Since inputs of the differential amplifier 11 become nearly equal in the period, the output of the differential amplifier 11 becomes about zero. Since the absolute value of the output becomes less than the level of the reference voltage 12, the comparator 13 detects an abnormal state of the inverter. If the state continues longer than the confirmation time (about several tens usec) previously set in the delay element 14, the inverter is deemed to be in the open-phase state and the abnormal state signal 15 is transmitted.

The delay element 14 is provided to prevent false detection of the open-phase state caused by influence of the OFF-OFF period provided for the shortcircuit protection between upper and lower arms of the inverter.

Fault of open-phase mode only is described in the above embodiment. Also regarding the simultaneous ignition of the pair of arms, i.e. fault of shortcircuit mode, if the voltage dividing is nearly equal at the transistors in the upper and lower arms, the abnormal state can be detected effectively according to the invention.

Although application to the inverter of a single phase bridge composed of four arms is disclosed in the embodiment, the invention may be applied to an inverter composed of a different number of arms.

Furthermore, elements to constitute each arm are not restricted to transistors, but any switching element may be used.

As above described, the abnormal state detecting circuit of an inverter according to the invention is constituted to detect the abnormal state of the inverter by comparing the potential at the output end of the upper and lower arms with the neutral potential of the DC power source. Consequently, the invention has the effect that the abnormal state can be rapidly detected in the case of a fault where overcurrent is not produced in the primary winding of the inverter transformer, such as open-phase mode or simultaneous ignition of the upper and lower arms.

What is claimed is:

1. An abnormal state detecting circuit of an inverter, wherein an inverter circuit is composed of arms of at least one pair, connected between positive and negative lines of a DC power source and turned on or off alternately, said detecting circuit comprising:

means for comparing the neutral potential of the pair of arms with the neutral potential of the DC power source; and means for discriminating the abnormal state of the switching operation of the arms if the comparison result becomes less than a prescribed value.

2. An abnormal state detecting circuit as set forth in claim 1, and further including a delay element and wherein said comparing means transmits the abnormal state signal through said delay element.

* * * * *